United States Patent

Strenz et al.

(10) Patent No.: US 9,887,006 B1
(45) Date of Patent: Feb. 6, 2018

(54) NONVOLATILE MEMORY DEVICE

(71) Applicant: Infineon Technologies AG, Neubiberg (DE)

(72) Inventors: Robert Strenz, Radebeul (DE); Robert Allinger, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/332,149

(22) Filed: Oct. 24, 2016

(51) Int. Cl.
*G11C 13/00* (2006.01)
*H01L 27/24* (2006.01)
*H01L 45/00* (2006.01)

(52) U.S. Cl.
CPC ........ *G11C 13/0069* (2013.01); *G11C 13/004* (2013.01); *G11C 13/0026* (2013.01); *G11C 13/0028* (2013.01); *G11C 13/0097* (2013.01); *H01L 27/2436* (2013.01); *H01L 27/2481* (2013.01); *H01L 45/14* (2013.01)

(58) Field of Classification Search
CPC ............ G11C 13/0069; G11C 13/0026; G11C 13/0028; G11C 13/004; G11C 13/0097
See application file for complete search history.

(56) References Cited

U.S. PATENT DOCUMENTS

| 7,274,587 | B2 * | 9/2007 | Yasuda ................... G11C 11/16 365/148 |
| 7,983,065 | B2 * | 7/2011 | Samachisa ............. B82Y 10/00 365/130 |
| 9,230,641 | B2 * | 1/2016 | Sekar ................. G11C 13/0002 |
| 9,502,468 | B2 * | 11/2016 | Yu ....................... G11C 13/0002 |
| 2002/0024380 | A1 | 2/2002 | Kono |
| 2006/0098473 | A1 | 5/2006 | Yasuda |
| 2006/0289924 | A1 | 12/2006 | Wang |
| 2010/0259960 | A1 | 10/2010 | Samachisa |
| 2011/0074359 | A1 | 3/2011 | Deng |
| 2011/0157959 | A1 | 6/2011 | Terai |
| 2011/0205780 | A1 | 8/2011 | Yasuda et al. |
| 2012/0327701 | A1 | 12/2012 | Nazarian |
| 2013/0027031 | A1 | 1/2013 | Dimitrov et al. |
| 2013/0027079 | A1 | 1/2013 | Nazarian et al. |
| 2014/0268990 | A1 | 9/2014 | Hong et al. |

OTHER PUBLICATIONS

Office Action dated Jun. 21, 2016 for Korean Patent Application No. 10-2015-0030926.

\* cited by examiner

*Primary Examiner* — Pho M Luu
(74) *Attorney, Agent, or Firm* — Schiff Hardin LLP

(57) ABSTRACT

A nonvolatile memory device having a first resistive element coupled between a common node and a bit line; a second resistive element coupled between the common node and a word line, wherein the first and second resistive elements are coupled between different metal layers; and a pass transistor having a gate coupled to the common node, a first node coupled to a reference voltage, and a second node coupled to an output, wherein the word line is orthogonal to the bit line.

20 Claims, 4 Drawing Sheets

|  | Set Operation | Reset Operation | Read Operation |
|---|---|---|---|
| WL_sel | + Vset | - Vset | Vread_WL |
| BL_sel | - Vset | + Vset | 0 |
| BLread_sel | 0 or float | 0 or float | Vread_BL |
| WL_uns | 0 or float | 0 or float | 0 |
| BL_uns | 0 or float | 0 or float | 0 |
| BLread_uns | 0 or float | 0 or float | 0 or float |

|  | SET State (RRAM1=HRS, RRAM2=LRS) | RESET State (RRAM1=LRS, RRAM2=HRS) |
|---|---|---|
| WL_sel BL_sel | ~ Vread_WL | 0 |
| WL_sel BL_uns | ~ Vread_WL; (BLread_uns= 0 or floating) | 0 |
| WL_uns BL_sel | 0 | 0 |
| WL_uns BL_uns | 0 | 0 |

NONVOLATILE MEMORY DEVICE

The present disclosure is a continuation of U.S. application Ser. No. 14/199,174 filed Mar. 6, 2014, which is now U.S. Pat. No. 9,502,468 issued Nov. 22, 2016.

BACKGROUND

Resistive random-access memory (RRAM or ReRAM) is a non-volatile memory in which a dielectric that is normally insulating, is configured to conduct after application of a sufficiently high voltage. The forming of a conduction path typically requires a relatively high voltage. Once the path (e.g., filament) is formed in the dielectric, the path may be RESET (broken, to provide high resistance) or SET (re-formed, to provide a low resistance) by an appropriately applied voltage. As used herein, an operation where a RRAM cell in a High-Resistive-State (HRS) changes to a Low-Resistive-State (LRS) is a SET operation. Conversely, an operation where a RRAM cell in an LRS changes to an HRS is a RESET operation.

There are several approaches in creating a memory device from an RRAM element. To achieve a smallest bit-cell size, a cross-point cell configuration can be used, where a single memory element is used as a memory cell without a select transistor. Although small in dimension, such architecture is subject to "sneak" parasitic currents flowing through non-selected neighboring memory cells.

In order to suppress the "sneak" parasitic currents, complementary resistive switches may be used. Complementary resistive switches may include two RRAM cells of opposite polarity connected to each other in series. For example, for any SET or RESET direction, one cell is in an HRS while the other is in an LRS. In this regard, the total resistance of the two complementary cells connected in series is Rtotal=RHRS+RLRS no matter which direction the cells are programmed. The advantage of a complementary switch configuration is the suppression of sneak path currents without the need for select devices (e.g., pass transistors). However, such configuration has the drawback of being subject to destructive read. Thus, every time the information of a memory cell is read, the memory content is destroyed. The memory content is typically recreated with an additional SET/RESET operation (e.g., write cycle).

Rewriting the content of the cell after every read reduces the life of a memory cell because the number of write operations is typically limited (e.g., 100,000 cycles). Additionally, recreating the information lost in the memory cell lowers the performance (i.e., speed), as a SET/RESET operation is required after every read access.

Another solution proposed to suppress the "sneak" parasitic currents is based on including a select transistor. For example, a one-transistor-one-resistor (1T1R) architecture has a select transistor to turn ON/OFF the path to the resistive cell. The drawback of the 1T1R RRAM configuration is that currents and/or voltages used for forming, SET, and RESET operations are passed through the select device. Using a select device poses a scaling challenge because RRAM cells generally require increasing forming voltages for decreasing bit-cell area. Further, SET/RESET conditions do not scale with bit-cell area. Thus, as the size of the RRAM is reduced, more current is required to flow through the pass transistor to perform a forming, SET, or RESET operation. However, as the RRAM cell in the 1T1R configuration is reduced, the select transistor cannot be reduced linearly with the resistive elements because it would not be able to accommodate the current requirements to perform the above operations. Accordingly, a 1T1R cell configuration poses a limitation for RRAM scaling.

DETAILED DESCRIPTION

The various examples disclosed herein generally relate to semiconductor technology, and more particularly, to a variable resistance memory device that stores data using a variable resistance material having different resistance states depending on an applied voltage. A complimentary RRAM architecture is used that does not include a select device and therefore can be easily scaled.

Figure 1A:
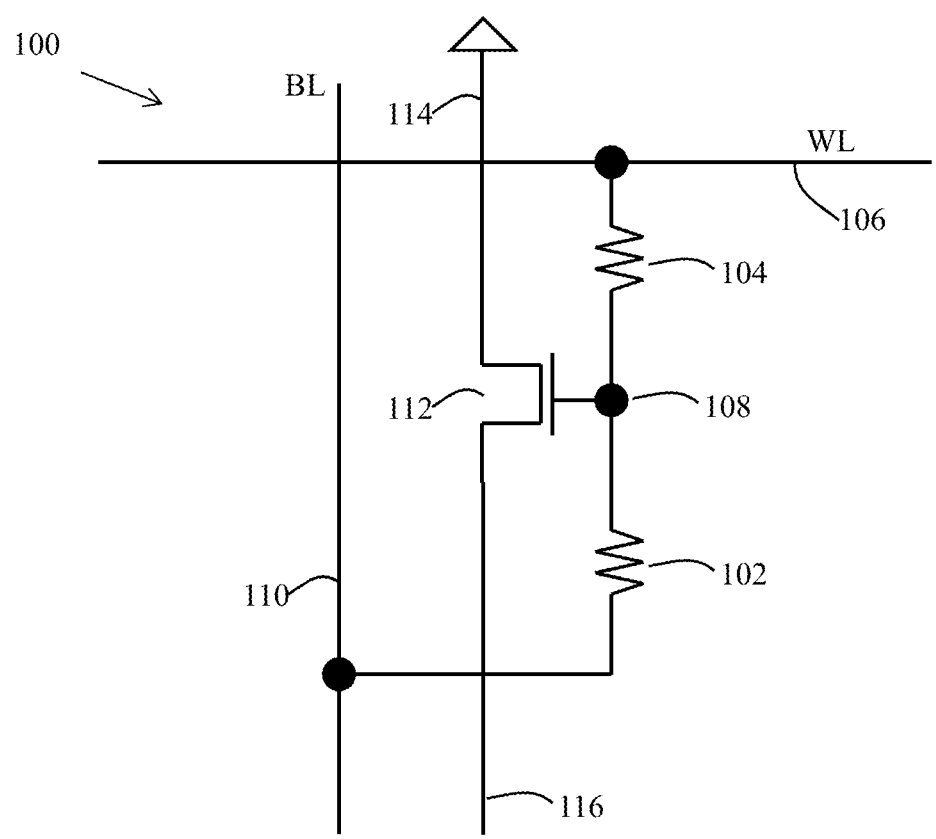
FIG. 1A illustrates a nonvolatile memory device in accordance with an exemplary embodiment.

FIG. 1A illustrates a nonvolatile memory device 100 in accordance with an exemplary embodiment. Memory device 100 includes a first resistive element 102, a second resistive element 104, and a pass transistor 112. The first and second resistive elements share a common node 108. The first resistive element 102 is coupled between the common node 108 and a bit line 110. The second resistive element 104 is coupled between the common node 108 and a word line 106. The word line 106 and the bit line 110 are not placed in the same direction. In one embodiment, these lines are substantially orthogonal. The pass transistor 112 of the memory cell 100 has a gate coupled to the common node 108.

A first node 114 (e.g., source) of the pass transistor 112 is coupled to a reference voltage. In one embodiment, this reference voltage is ground. It will be understood that the reference voltage may be any other suitable voltage. The second node 116 (e.g., drain) of the pass transistor 112 (e.g., BL_Read) is the output of the memory device 100. In one embodiment, pass transistor 112 is a Metal Oxide Semiconductor (MOS). For example, pass transistor 112 may be an N-channel MOS (NMOS) or a P-channel MOS (PMOS). In other embodiments, bipolar transistors (e.g., PNP or NPN) can be used instead of MOS transistors.

In various embodiments, at least one of the two resistive elements 102 and 104 is a variable resistance cell. For example, the first resistive element 102 may be a fixed resistor while the second resistive element 104 is a variable resistance cell. In another embodiment, the second resistive element 104 may be a fixed resistor while the first resistive element 102 is a variable resistance cell. In yet another embodiment, both the first resistive element 102 and the second resistive element are variable resistance elements. For purposes of simplicity, it will be assumed that both the first resistive element 102 and the second resistive element are variable resistance elements (e.g., RRAMs), while it will be understood that different combinations of resistive elements are supported as well.

Figure 1B:
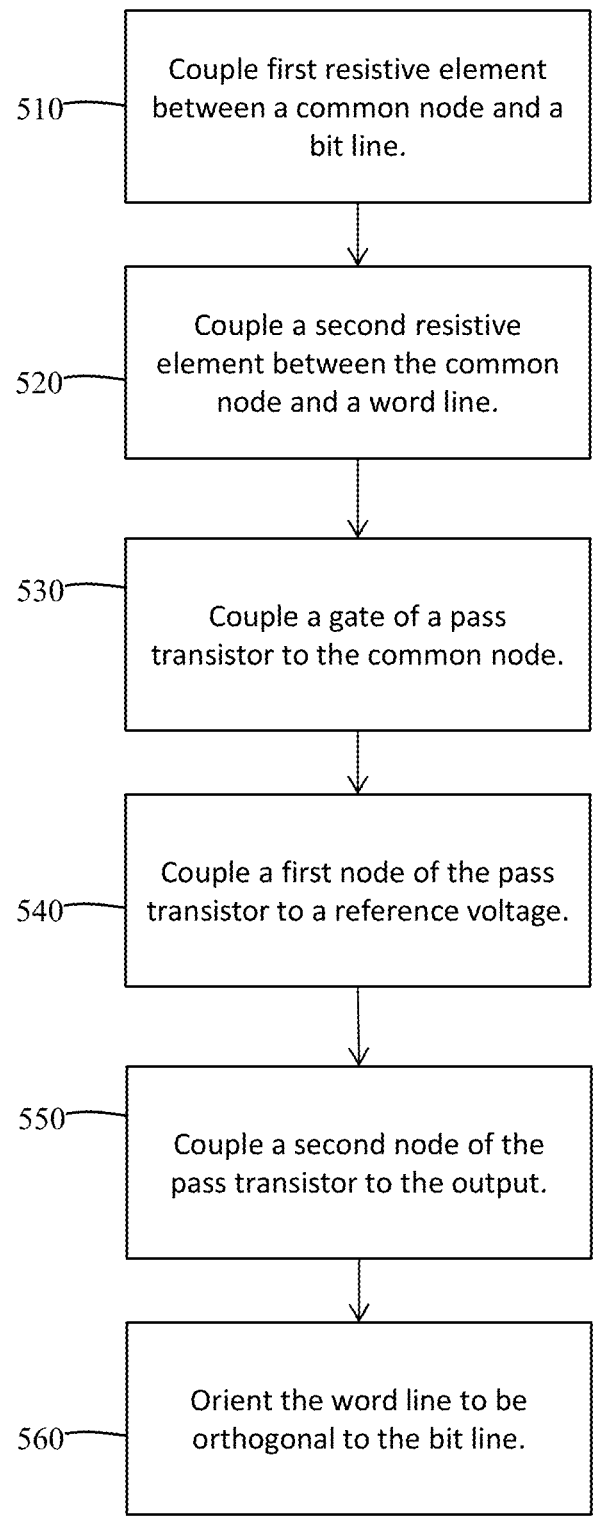
FIG. 1B illustrates an exemplary method of producing a nonvolatile memory.

FIG. 1B illustrates an exemplary method of producing a nonvolatile memory. In step 510, the first resistive element 102 is coupled between a common node 108 and a bit line 110. In step 520, a second resistive element 104 is coupled between the common node 108 and the word line 106. In step 530, the gate of the pass transistor 112 is coupled to the common node 108. In step 540, the first node 114 of the pass transistor 112 is coupled to a reference voltage (e.g., ground). In step 550, the second node 116 of the pass transistor 112 is coupled to the output. In step 560, the word line 106 is oriented to be orthogonal to the bit line 110. It will be understood that that the flow in FIG. 1B is merely an example and that the method can of course be performed in other orders or with more steps as well.

In one embodiment, the first resistive element 102 has a first polarity and the second resistive element 104 has a second polarity, where the first polarity is opposite to that of the second polarity. Accordingly resistive elements 102 and 104 can be described as "complementary switches." The complementary polarity of the two resistive elements (e.g., RRAMs) may have several reasons. In one embodiment, the complementary polarity is due to an inverted layer structure of the RRAM cell stack (e.g. first resistive element 102 comprises Pt/Ta$_2$O$_5$/TaOx/Ir, while the second resistive element 104 comprises Ir/TaOx/Ta$_2$O$_5$/Pt). In another embodiment, instead of using an inverted layer structure, different materials (e.g., TiN/HfO$_2$/Hf/TiN may be used for first resistive element 102 and TiN/Ti/TiO$_2$/TiN may be used for the second resistive element 104.)

Figure 2:
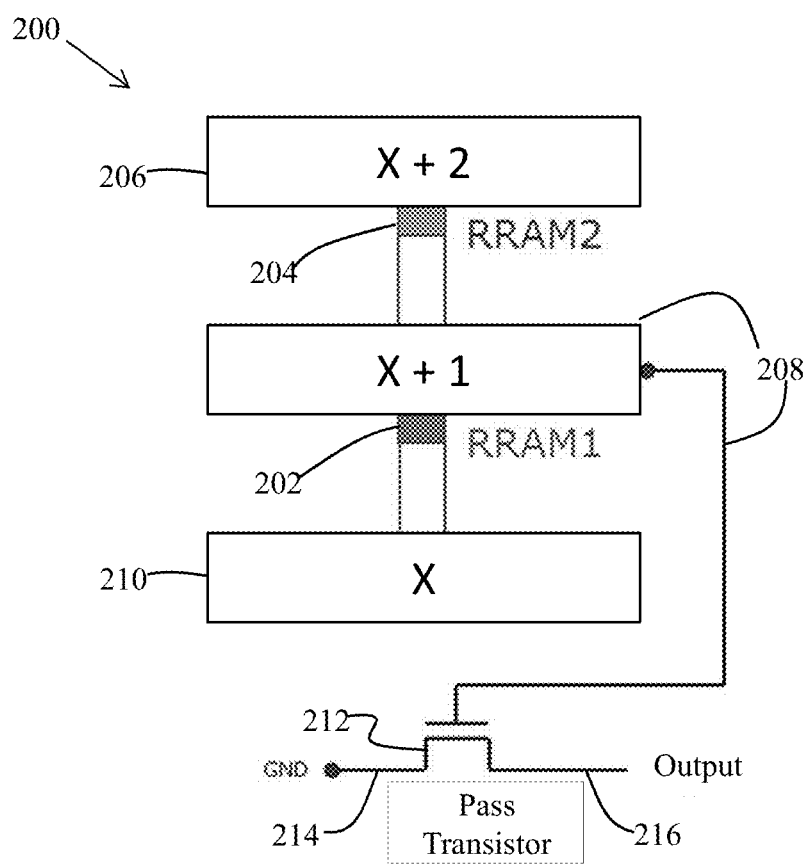
FIG. 2 illustrates a partial cross section of a nonvolatile memory device having several layers in accordance with an exemplary embodiment.

FIG. 2 illustrates a partial cross section view of a non-volatile memory device 200 having several layers in accordance with an exemplary embodiment. For simplicity, layers that are in the substrate of the memory chip are not displayed because they may be implemented according to known methods.

Memory device 200 includes a pass transistor 212, which has a first node 214 (e.g., source) coupled to a reference voltage (e.g., ground). The second node 216 (e.g., drain) of the pass transistor 212 (e.g., BL_Read) is the output of the memory device 200. The gate of the pass transistor 212 is coupled to a common node 208, which is on a metal layer higher than the metal layer of the bit line 210 (i.e., at least one metal layer higher). In the example of FIG. 2, memory device 200 has a bit line 210 on metal X (e.g., first metal layer).

The first resistive element 202 is coupled between the metal X (e.g., first metal layer) and metal X+1 (e.g., second metal layer). As illustrated in FIG. 2, metal X+1 (e.g., second metal layer) is on a higher metal layer than metal X (e.g., first metal layer). The second resistive element 204 is coupled between metal X+1 (e.g., second metal layer) and metal layer X+2 (e.g., third metal layer), where metal X+2 is on a higher metal layer than metal X+1.

In one embodiment, the second resistive element 204 is stacked on top of the first resistive element 202. Thus, resistive element 204 has the same dimensions and is immediately vertically above resistive element 202. As discussed above, the first resistive element 202 may have a polarity that is opposite that of the second resistive element 204. Thus, when the first resistive element 202 is SET, the second resistive element 204 is RESET, and visa versa. Put differently, the SET/RESET operations of the first and second resistive elements 202 and 204, respectively, are performed simultaneously.

In one embodiment, the pass transistor 212 of the non-volatile memory device 200 of FIG. 2 is configured to be scaled linearly with the first and second resistive elements 202 and 204 in a scaling operation. The forming, SET, and RESET operations are not performed through the pass transistor 212. Rather, they are performed by creating a voltage and/or current path between the word line 206 and bit line 210 through the first and second resistive elements 202 and 204. Thus, the dimensions of the pass transistor 212 are based on the required read current, which is not subject to the same scaling limitations discussed before.

While FIG. 2 illustrates a first and second resistive elements 202 and 204 that are between different metal layers, it will be understood based on the concepts discussed herein that in another embodiment the first and second resistive elements 202 and 204 may be between the same metal layers. For example, both the first and second resistive elements 202 and 204 may be between metals X (210) and X+1 (208) or between metals X+1 (208) and X+2 (206). In yet another embodiment, the bit line may be on a higher metal layer than the word line with respect to the pass transistor 212.

Unlike known select transistors, the dimensions of the pass transistor 212 are based on the required read current, which is not subject to the scaling limitations discussed above. That is because the pass transistor 212 does not provide the current and/or voltage for the SET, RESET, and forming operations, as discussed further below. The read current flowing between the first node 214 and the second node 216 of the pass transistor 212 largely depends on the voltage at the gate (i.e., common node 208) of the pass transistor 212. In this regard, the voltage at the common node 208 is established by the first and second resistive elements 202 and 204 as they form a voltage divider between the word line 206 and bit line 210. The voltage at common node 208, that is the gate voltage $V_{GATE}$ of pass transistor, is provided by Equation 1 below:

$$V_{GATE} = (V_{WL} - V_{BL})\left(\frac{R_1}{R_1 + R_2}\right) \quad \text{(Equation 1)}$$

Where:
$R_1$=Resistance of the first resistive element 202;
$R_2$=Resistance of the second resistive element 204;
$V_{WL}$, =Voltage of the word line 206; and
$V_{BL}$=Voltage of the bit line 210.

Accordingly, the control voltage at the gate of the pass transistor 212 is established by the voltage divider of the complementary resistive elements 202 and 204 using the voltage difference between the word line 206 and the bit line 210. Using the voltage divider configuration discussed herein provides a substantially larger read window as compared to standard 1T1R cell architectures using a pass transistor. This is because in this voltage divider configuration the reading operation is of a differential nature, that is, the reading signal is derived by comparing RLRS relative to RHRS according to Equation 1, with RLRS and RHRS for RRAMs typically being substantially different (e.g., by a factor of 100 or more). In contrast, for 1T1R cell architectures the reading currents associated with RLRS and RHRS are compared to a reference current corresponding to a resistance that needs to be higher than RLRS, but lower than RHRS.

In one embodiment, memory device 100 of FIG. 1A is used in a field programmable gate array (FPGA). In this regard, stacking two resistive elements 102 and 104 on one another provides an area efficient implementation of an FPGA. Further, a single SET or RESET operation is sufficient to store a bit of information in the memory device 100 because of the complementary polarity of the resistive elements 102 and 104. Thus, the states of the resistive elements 102 and 104 are LRS/HRS and HRS/LRS, respectively, after any single SET/RESET operation. Additional circuitry is therefore not needed for separate LRS/HRS programming of the two resistive elements 102 and 104. Thus, unlike conventional FPGA-RRAMs that include cells of the same polarity, the nonvolatile memory device discussed herein does not require additional circuitry, thereby further reducing power consumption and chip real estate.

Further, unlike conventional complementary switch architectures that are subject to a destructive read, in memory device 100 the bit information is maintained after a read operation. Thus, the memory content in memory device 100 is not destroyed in a read operation and therefore does not need to be recreated with an additional SET/RESET operation (e.g., write cycle).

Figure 3:
FIG. 3 is a table describing SET, RESET, and read operations on a memory device in accordance with an exemplary embodiment.

FIG. 3 is a table 300 describing SET, RESET, and read operations in a memory device in accordance with an exemplary embodiment. Table 300 is best understood in view of memory device 100 of FIG. 1A. As discussed above, the polarity may be changed by SET/RESET operation on the first and second resistive elements 102 and 104. For discussion purposes, it will be assumed that the first resistive element 102 has a polarity that is in HRS for a positive word line 106 voltage with respect to the bit line voltage 110.

During a SET operation, the word line 106 is brought to a first programming voltage (e.g., +Vset) while the bit line 110 is brought to a second programming voltage (e.g., −Vset). For example, the first and second programming voltages may be any suitable voltage, including, but not limited to, 1V to 2V and −1V to −2V, respectively. In one embodiment, the first programming voltage has a polarity that is opposite to that of the second programming voltage.

Thus, during the SET operation, there is a current path between the word line 106 and the bit line 110 through the second resistive element 104 and first resistive element 102. The output of the memory device 100 (i.e., bit line read node 116) is at ground or floating. Similarly, the word lines and bit lines that are not selected may also be at ground or floating.

In a RESET operation, the word line 106 is brought to the second programming voltage (e.g., −Vset) while the bit line 110 is brought to the first programming voltage (e.g., +Vset). Thus, there is a current path between the bit line 110 and the word line 106 through the first resistive element 102 and second resistive element 104. Put differently, the current flowing through the first and second resistive elements in a RESET operation is in a direction that is opposite to that of a SET operation. The output of the memory device 100 (i.e., bit line read node 116) is at ground or floating. Similarly, the word lines and bit lines that are not selected may also be at ground or floating.

Accordingly, a "1" can be stored in the memory device 100 by applying a first programming voltage to the word line 106 while applying a second programming voltage to the bit line 110. The first and second programming voltages may be of equal magnitude but opposite polarity. The first programming voltage is positive and the second programming voltage is negative. Similarly, a "0" can be stored in the memory device 100 by applying the second programming voltage to the word line 106 while applying the first programming voltage to the bit line 110.

During a read operation, the word line 106 is brought HIGH while the bit line 110 is brought LOW (e.g., ground). A HIGH voltage may be any suitable voltage, such as 1V. However, it will be understood that this voltage may be tailored for different applications.

Thus, during a read operation, there is a current path between the word line 106 and bit line 110 through the second resistive element 104 and first resistive element 102. There is therefore a voltage divider effect on node 108 due to the first and second resistive elements 102 and 104, respectively. The output of the memory device 100 (i.e., selected bit line read node 116) is biased with a reading voltage that acts as drain voltage of the pass transistor 212. This voltage may be any suitable voltage, such as equal to or greater than 0.5V and equal to or less than 1.5V. However, it will be understood that this voltage may be tailored for different applications. Word lines and bit lines that are not selected may be at ground.

Figure 4:
FIG. 4 is a table that provides gate voltages of the pass transistor in SET and RESET state in accordance with an exemplary embodiment.

FIG. 4 is a table 400 that provides gate voltages of the pass transistor in SET and RESET states during a read operation for selected and unselected word lines and bit lines in accordance with an exemplary embodiment. In SET state, the first resistive element 102 is in a HRS while the second resistive element 104 is in a LRS. During a read operation, when both the word line 106 and the bit line 110 are selected (e.g., word line is brought HIGH and bit line is grounded as shown in table 300), the voltage at the gate of the pass transistor 108 is similar to that of the word line voltage 106, because the resistance of the first resistive element is high while there is small voltage drop across the second resistive element 104. Thus, if an NFET is used for the pass transistor 112, the NFET is turned ON, providing a non-zero reading current at the output 116.

Similarly, during a read operation, when the word line 106 is selected but the bit line 110 is not selected (e.g., not HIGH), the voltage at the gate of the pass transistor 108 is similar to that of the word line voltage 106 because the first resistive element is HRS while there is small voltage drop across the second resistive element 104 due to it being in a LRS.

During a read operation where the word line 106 is not selected (e.g., not HIGH but grounded) but the bit line 110 is selected (e.g., not HIGH but grounded), the voltage at the gate of the pass transistor 112 is 0. Thus, pass transistor 112 is in an OFF state during a read operation and the output 116 does not provide a reading current.

During a read operation where both the word line 106 and the bit line 110 are not selected (e.g., not HIGH), the voltage at the gate of the pass transistor 112 is 0 because the second resistive element 104 is in a LRS, enabling the voltage at the gate of the pass transistor 112 to be closer to that of the word line 106. Thus, pass transistor 112 is in an OFF state during a read operation and the output 116 does not provide a reading current.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method. Further, as discussed above, bipolar transistors (e.g., PNP or NPN) can be used instead of MOS transistors. A PNP may be used instead of NPN, and a PMOS may be used instead of NMOS. Accordingly, it is intended that the disclosure be limited only in terms of the appended claims.

What is claimed is:

1. A nonvolatile memory device, comprising:
a first resistive element coupled between a common node and a bit line;
a second resistive element coupled between the common node and a word line, wherein the first and second resistive elements are coupled between different metal layers; and
a pass transistor having a gate coupled to the common node, a first node coupled to a reference voltage, and a second node coupled to an output,
wherein the word line is orthogonal to the bit line.

2. The nonvolatile memory device of claim 1, wherein at least one of (i) the first resistive element and (ii) the second resistive element is a variable resistance cell.

3. The nonvolatile memory device of claim 1, wherein:
each of the first and second resistive elements is a variable resistance cell;
the first resistive element has a first polarity and the second resistive element has a second polarity; and
the first polarity is opposite to that of the second polarity.

4. The nonvolatile memory device of claim 3, wherein:
the first resistive element and the second resistive element have opposite polarities;
the first resistive element comprises Pt/Ta$_2$O$_5$/TaOx/Ir; and
the second resistive element comprises Ir/TaOx/Ta$_2$O$_5$/Pt.

5. The nonvolatile memory device of claim 3, wherein the first resistive element comprises material that is different from the second resistive element.

6. The nonvolatile memory device of claim 1, wherein a bit stored in the nonvolatile memory device is not destroyed during a read operation.

7. The nonvolatile memory device of claim 1, wherein the pass transistor is configured to be scaled linearly with the first and second resistive elements during a scaling operation.

8. The nonvolatile memory device of claim 1, wherein the second resistive element is stacked on top of the first resistive element, and the bit line is located in a higher metal layer than the word line with respect to the pass transistor.

9. The nonvolatile memory device of claim 1, wherein the first and second resistive elements have a complementary switch configuration.

10. The nonvolatile memory device of claim 1, wherein the first and second resistive elements are configured to be one SET and the other RESET simultaneously.

11. The nonvolatile memory device of claim 1, wherein the pass transistor has dimensions that are based on a read current at the output.

12. The nonvolatile memory device of claim 1, wherein a voltage V$_{GATE}$ at the gate of the pass transistor is based on:
a voltage V$_{WL}$ on the word line;
a voltage V$_{BL}$ on the bit line;
a resistance R$_1$ of the first resistive element; and
a resistance R$_2$ of the second resistive element, wherein:

$$V_{GATE} = (V_{WL} - V_{BL})\left(\frac{R_1}{R_1 + R_2}\right).$$

13. The nonvolatile memory device of claim 1, wherein the memory device is configured to store a "1" when the word line is at a first programming voltage and the bit line is at a second programming voltage, and
wherein the first and second programming voltages are of equal magnitude, the first programming voltage is positive and the second programming voltage is negative.

14. The nonvolatile memory device of claim 1, wherein the memory device is configured to store a "0" when the word line is at a second programming voltage and the bit line is at a first programming voltage, and
wherein the first and second programming voltages are of equal magnitude, the first programming voltage is positive, and the second programming voltage is negative.

15. A field programmable gate array (FPGA) comprising the nonvolatile memory device of claim 1.

16. A nonvolatile memory device, comprising:
a first resistive element coupled between a common node and a bit line;
a second resistive element coupled between the common node and a word line, wherein the first and second resistive elements are coupled between the same metal layers; and
a pass transistor having a gate coupled to the common node, a first node coupled to a reference voltage, and a second node coupled to an output,
wherein the word line is orthogonal to the bit line.

17. A method of producing a nonvolatile memory, comprising:
coupling a first resistive element between a common node and a bit line;
coupling a second resistive element between the common node and a word line;
coupling a gate of a pass transistor to the common node;
coupling a first node of the pass transistor to a reference voltage;
coupling a second node of the pass transistor to an output; and
orienting the word line to be orthogonal to the bit line.

18. The method of claim 17, wherein at least one of (i) the first resistive element and (ii) the second resistive element is a variable resistance cell.

19. The method of claim 17, further comprising configuring the nonvolatile memory such that during a write operation one of:
(i) a SET on the first resistive element and a RESET on the second resistive element are performed simultaneously, and
(ii) a RESET on the first resistive element and a SET on the second resistive element are performed simultaneously.

20. The method of claim 17, further comprising configuring the nonvolatile memory to:
store a "1" in the memory when a first programming voltage is applied to the word line while a second programming voltage is applied to the bit line; and
store a "0" in the memory when the second programming voltage is applied to the word line while the first programming voltage is applied to the bit line, wherein:
the first programming voltage and the second programming voltage are of equal magnitude but opposite polarity, and the first programming voltage is positive and the second programming voltage is negative.

* * * * *